United States Patent [19]

Gutek

[11] Patent Number: 4,824,875
[45] Date of Patent: Apr. 25, 1989

[54] UV CURABLE CONFORMAL COATING WITH MOISTURE SHADOW CURE

[75] Inventor: Beth I. Gutek, Freeland, Mich.

[73] Assignee: Dow Corning Corporation, Midland, Mich.

[21] Appl. No.: 118,086

[22] Filed: Nov. 6, 1987

[51] Int. Cl.$^4$ ............................................... C08F 2/50
[52] U.S. Cl. .................................... 522/9; 522/10; 522/14; 522/99; 528/17; 528/26; 528/32; 528/33; 528/41; 528/901
[58] Field of Search ............. 522/10, 66, 99, 91, 522/14, 104, 9; 528/17, 901, 32, 26, 41

[56] References Cited

U.S. PATENT DOCUMENTS

| | | | |
|---|---|---|---|
| 3,992,275 | 11/1976 | Shahidi et al. | 522/10 |
| 4,131,529 | 12/1978 | Osterloh et al. | 522/10 |
| 4,247,623 | 1/1981 | Guild | 522/142 |
| 4,318,791 | 3/1982 | Felder et al. | 430/281 |
| 4,528,081 | 7/1985 | Lien et al. | 522/99 |
| 4,582,862 | 4/1986 | Berner et al. | 522/39 |
| 4,608,270 | 8/1986 | Varaprath | 522/99 |
| 4,699,802 | 10/1987 | Nakos et al. | 522/99 |

Primary Examiner—John C. Bleutge
Assistant Examiner—Ralph H. Dean, Jr.
Attorney, Agent, or Firm—Roger H. Borrousch

[57] ABSTRACT

A conformal coating composition is made from a mixture of acrylamide functional polydimethylsiloxane, a methacrylate functional/dialkoxy polydiorganosiloxane, reactive diluent including isobornyl acrylate, cyclohexyl acrylate, and 2-ethylhexyl acrylate; a photoinitiator combination of 2-hydroxy-2-methylphenylpropanone and 2-methyl-1-[4-(methylthio)phenyl]-2-morpholenopropanone, an amine including dimethylethanolamine and diisopropylethylamine, and an organic titanate. The composition has a viscosity of from 0.07 to 0.2 Pa.s at 25° C. and cures by exposure to ultraviolet radiation and to atmospheric moisture, i.e. a dual curing composition. This composition cures too fast by exposure to ultraviolet radiation in the presence of nitrogen resulting in a distorted surface and therefore for coating printed circuit boards it is recommended that it be cured in air so that the rate of cure is reduced and no surface distortions are formed.

16 Claims, No Drawings

UV CURABLE CONFORMAL COATING WITH MOISTURE SHADOW CURE

BACKGROUND

1. Field of the Invention

This invention relates to a coating composition which can cure by exposure to ultraviolet radiation and also has capabilities of curing by exposure to moisture at room temperature. The ability to cure at room temperature provides the coating composition with a characteristic which allows it to be used for coating application where the possibility of exposing all the area of a coated substrate with ultraviolet radiation are so unlikely, so impractical, that one may say it is impossible. This cure process which cures without the exposure to ultraviolet radiation can be termed "shadow cure" or "dark cure" meaning cure which occurs without being exposed to the ultraviolet radiation, i.e. cures in the shadow of the exposure or in the dark areas when the ultraviolet radiation is directed on the substrate.

2. Background Information

Compositions which cure by exposure to ultraviolet radiation are well known in the art, although the number of such materials found in commercial usage today are still relatively small. An even smaller number of such compositions are known to the art which both cure by exposure to ultraviolet radiation and also by another mechanism, such as by heat. Compositions which cure by two mechanisms are said to have dual cure.

Compositions which cure by exposure to ultraviolet radiation and by exposure to moisture, i.e. a dual cure, are also known in the art as shown by Lien et al in U.S. Pat. No. 4,528,081, issued July 9, 1985. Lien et al describe a dual curing silicone composition which contains an acrylic functional dialkoxy or diaryloxy silyl group terminated polyorganosiloxane, an effective amount of a photosensitizer, and a silicone moisture curing catalyst. These compositions of Lien et al can also contain trimethylsilyl terminated silicone oil. Lien et al describe their materials as curing to soft gel like materials or soft rubbery materials. In their examples, the cured materials are defined as a soft rubbery material at 0% oil to a very soft sticky gel at 70% oil which showed a tendency to creep but would not flow.

SUMMARY OF THE INVENTION

The present invention is a composition which has dual cure properties, i.e., ultraviolet radiation cure and moisture cure. These compositions are designed to be used as conformal coatings and have uncured properties, curing characteristics, and cured properties which makes them particularly useful to coat printed circuit boards or printed wire boards.

This invention relates to a composition comprising (A) at least 20 weight percent based on the total weight of the composition of an acrylamide polydimethylsiloxane having acrylamide end groups bonded to silicon atoms through Si-C bonds and on the average at least 20 to less than 300 dimethylsiloxane units per molecule, (B) at least 20 weight percent based on the total weight of the composition of a polydiorganosiloxane having endgroups containing both alkoxy groups and methacrylate groups where there are two alkoxy groups per endgroup bonded to silicon through an Si-O bond and one methacrylate group bonded to silicon through an Si-C bond and having on the average less than 350 diorganosiloxane units per molecule, said diorganosiloxane units being selected from dimethylsiloxane units, diphenylsiloxane units, and methylphenylsiloxane units wherein at least 50 percent of the organic groups of the diorganosiloxane units are methyl, (C) at least 20 weight percent based on the total weight of the composition of a reactive diluent selected from the group consisting of isobornyl acrylate, cyclohexyl acrylate, and 2-ethylhexyl acrylate, (D) from 0.5 to 10 weight percent based on the total weight of the composition of a photoinitiator combination in which there is at least 0.25 weight percent of

and at least 0.25 weight percent of

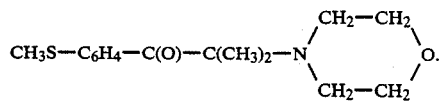

(E) from 0.1 to 2 weight percent based on the total weight of the composition of an amine selected from the group consisting of dimethylethanolamine and diisopropylethylamine, and (F) from 0.05 to 1 weight percent based on the total weight of the composition of an organic titanate, where the composition has a viscosity at 25° C. in the range of 0.07 to 0.2 Pa.s.

DESCRIPTION OF THE PREFERRED EMBODIMENTS

The compositions of the present invention cure extremely fast and because they cure so fast, it is necessary to cure them in the presence of air (oxygen) to slow the rate of cure down. As conformal coatings, the fast cure in an inert atmosphere causes the surface to distort, such as become wrinkled. The distortion causes an unattractive surface, but probably more importantly, it can also cause unacceptable stresses to be exerted on the components of a printed circuit board. Being able to develop compositions having a low viscosity, having the ability to cure by both UV radiation and moisture to films which have low temperature flexibility, and having a UV cure so fast under a nitrogen gas atmosphere that the cure is done in air to slow the reaction down, was unexpected.

The acrylamide polydimethylsiloxane (A) contains at least 20 siloxane units and less than 300 siloxane units. These siloxane units contain two acrylamide functional groups on the terminal units where the acrylamide groups are bonded to silicon atoms through Si-C bonds. The acrylamide functional polydimethylsiloxanes are known in the art from Varaprath in U.S. Pat. No. 4,608,270, issued Aug. 26, 1986, and is hereby incorporated by reference to show the polydimethylsiloxanes with acrylamide functionality and to show the methods of making such polymers. The polydimethylsiloxanes which are useful in the present invention are those which have from 20 to less than 300 siloxane units and two terminal siloxane units with acrylamide groups. The siloxane units include dimethylsiloxane units and siloxane units of the formula

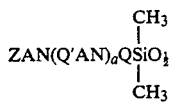

in which Z is H or R, R is a monovalent hydrocarbon radical, Q and Q' are divalent hydrocarbon radicals, A is an acyl radical having the formula

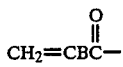

where B is H or CH$_3$ and a is 0 or 1. The monovalent hydrocarbon radicals, R, can be alkyl radicals such as methyl, ethyl, propyl, butyl, hexyl, and octyl; cycloaliphatic radicals such as cyclohexyl; aryl radicals such as phenyl, benzyl, styryl, tolyl, and xenyl; and alkenyl radicals such as vinyl and allyl. Q and Q' are divalent hydrocarbon radicals such as ethylene, propylene, isopropylene, butylene, isobutylene, hexylene, octylene, and phenylene. Q is preferably ethylene and Q' is preferably propylene or isobutylene. When B is hydrogen, the acyl radical is acrylyl radical and when B is methyl, the acyl radical is methacrylyl radical. Polydimethylsiloxanes endblocked with

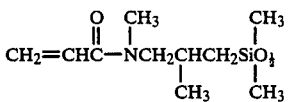

are preferred when there are from 20 to 125 siloxane units per molecule. The most preferred acrylamide polydimethylsiloxanes of (A) are those which have from 70 to 110 siloxane units per molecule. The amount of (A) in the compositions of the present invention is at least 20 weight percent based on the total weight of the composition. The preferred amount of (A) is from 25 to 40 weight percent based on the total weight of the composition.

The polydiorganosiloxane (B) contains dimethylsiloxane units, diphenylsiloxane units, and methylphenylsiloxane units to provide on the average less than 350 siloxane units, preferably less than 100 siloxane units. The polydiorganosiloxane (B) is preferably endblocked with (gamma-methyacryloxyalkyl)dimethoxy-siloxy units where the alkyl is preferably propylene or isobutylene and preferably contain on the average from 10 to 60 siloxane units per molecule. The most preferred compositions contain polydiorganosiloxane (B) in which there are from 40 to 60 siloxane units per molecule. The polydiorganosiloxanes can be single polymers which provide the required average number of siloxane units per molecule or they can be mixtures of polymers which provide the required average number of siloxane units per molecule. These polydiorganosiloxanes of (B) can be prepared, for example, by mixing hydroxyl endblocked polydiorganosiloxane, a silane such as gamma-methyacryloxypropyltrimethoxysilane or gamma-methacryloxyisobutyltrimethoxysilane, in the presence of a catalytic amount of alcoholic potassium hydroxide. It is recommended that polymerization inhibitor be used during this process and can include such compounds as phenothiazine and para-methoxyphenol. A slight excess of the theoretical amount of silane is recommended to ensure complete reaction, such as 10 weight percent excess. The ingredients are mixed and heated to remove the stoichiometric amount of methanol (in this illustrated method). After the stoichiometric amount of alcohol is removed, the resulting mixture is neutralized with acetic acid. The polydiorganosiloxanes of (B) have a general formula

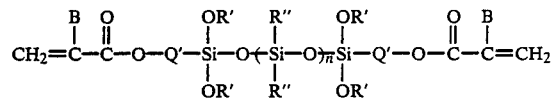

where B is H or methyl, Q' is a divalent alkylene radical such as propylene or isobutylene, R' is an alkyl radical such as methyl, ethyl or propyl, each R" is methyl or phenyl, and n is an average value of less than 350. The resulting polydiorganosiloxane (B) made from the process defined herein may contain some unreacted silane because an excess is used. Because such an excess is usually in the range of less than 20 weight percent, the compositions of this invention can include the excess silane, such as from 5 to 15 weight percent based on the weight of the product of the process. The polydimethylsiloxane (B) is present in an amount of at least 20 weight percent based on the total weight of the composition. The preferred compositions of this invention contain from 20 to 30 weight percent polydiorganosiloxane (B) based on the total weight of the composition.

The reactive diluent (C) is used to reduce the viscosity of the composition and to provide tougher cure films and coatings. The reactive diluent must be compatible with the rest of the ingredients of the composition and react during the curing process so that they become part of the cured product. Reactive diluents include isobornyl acrylate, cyclohexyl acrylate, and 2-ethylhexyl acrylate. The compositions can also contain small amounts of multifunctional acrylates, such as up to 10 weight percent based on the weight of the composition. Reactive diluent (C) is preferably isobornyl acrylate. Reactive diluent (C) is present in the composition in an amount of at least 20 weight percent based on the total weight of the composition. The preferred composition of this invention contain an amount of isobornyl acrylate of from 25 to 45 weight percent based on the total weight of the composition.

The photoinitiator (D) is present in an amount of from 0.5 to 10 weight percent of a combination based on the total weight of the composition in which there is at least 0.25 weight percent of

and at least 0.25 weight percent of

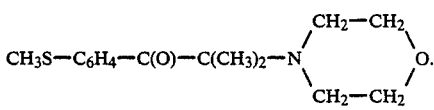

Photoinitiator combination (D) is preferably present in an amount of from 1 to 5 weight percent in which 2- hydroxy-2-methylphenylpropanone provides an amount of from 1.5 to 3 weight percent and 2-methyl-1-[4-(methylthio)phenyl]-2-morpholenopropanone provides an amount of from 1.5 to 3 weight percent. It was quite unexpected that a combination of photoinitiators together with an amine and organic titanate would provide a fast UV curing composition which also had moisture curing characteristics. Although some other photoinitiator combinations improved the rate of UV cure, the overall properties of the compositions of the present invention were superior as a conformal coating for printed wire boards.

Amine (E) is dimethylethanolamine or diisopropylethylamine and is present in an amount of from 0.1 to 2 weight percent, preferably from 0.5 to 1.5 weight percent, wherein the weight percentages are based on the total weight of the composition. These amines reduce the surface tackiness. The preferred amine is dimethylethanolamine.

The organic titanate catalyst of (F) provides the moisture curability for the composition and can be any of the conventional organic titanates such as tetraisopropyl titanate, tetrabutyl titanate, bis(acetylacetonate)-diisopropyl titanate, and bis(ethoxyacetylacetonate)-diisopropyl titanate. The amount of the organic titanate should be sufficient enough to catalyst the composition when exposed to atmospheric moisture after having been exposed to ultraviolet radiation. This amount of organic titanate is from 0.05 to 1 weight percent based on the total weight of the composition. Thus, any organic titanate which undergoes some reaction from ultraviolet radiation may not be suitable if it looses its ability to cause the curing reaction in the shadowed areas. Also the amount of organic titanate should not be so great as to influence the ultraviolet radiation curing mechanism. A preferred range of organic titanate is from 0.05 to 1 weight percent based on the total weight of the composition. A preferred organic titanate is tetrabutyl titanate.

The compositions of the present invention can also contain a photosensitizer which can influence the ultraviolet radiation curing by improving the rate of cure and uniformity of the cure. These photosensitizers include dyes, for example, 4-methyl-7-(N,N-diethylamino)-coumarin. These photosensitizers are preferably present in small amounts such as less than 0.5 weight percent based on the total weight of the composition.

Adhesion additive can also be present in the present compositions. One adhesion additive which has been found to be useful is a mixture of hexamethoxysilethylene and pentaerythritol, which is particularly useful in the weight ratio of 40 to 60 weight percent of the hexamethoxysilethylene and 40 to 60 weight percent of the pentaerthritol based on the weight of the adhesion additive. The hexamethoxysilethylene has a formula

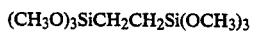

These adhesion additives ensure the adhesion of the conformal coating to the printed circuit boards.

The compositions of the present invention can also contain certain other additives which are not detrimental to the curing characteristics, the storage stability, the cured film, and the usefulness of the cured film. Such additives include antioxidants and storage stabilizers.

Substrates which are populated with devices having geometries such that coating them produces areas where the composition would be in the shadows when the ultraviolet radiation is directed at the surface. Such populated devices can be coated with the compositions of this invention and can be cured in areas where the ultraviolet radiation strikes, as well as, in the shadow area. The composition in the shadow areas will cure by merely being exposed to atmospheric moisture. Such substrates include populated printed circuit boards or printed wire boards.

The compositions of the present invention have two photocurable polymers, i.e., the acrylamide functional polyorganosiloxane and the methacryloxy functional polydiorganosiloxane. This two polymer combination cures faster when exposed to ultraviolet radiation than compositions containing only the methacryloxy functional polydiorganosiloxanes. The methacryloxy functional polydiorganosiloxane is required because it provides the groups which have the ability to moisture cure. The compositions of the present invention also cure to clear materials. This characteristic is observed when materials, which would otherwise be incompatible when reacted, coreact. If the two functional polymers did not coreact, the cured products would result in hazy or opaque materials, if they cured at all. Compositions which contain these two types of photocurable polyorganosiloxanes are described in my copending application. entitled "Compositions Having UV Cure With Moisture Shadow Cure", which is assigned to the same assignee and was filed on even date herewith.

The compositions of the present invention have a combination of properties including being solventless, being low in viscosity (0.07 to 0.2 Pa.s, when measured at 25° C.) and curing to flexible materials exhibiting cold temperature flexibility. Being solventless and low in viscosity is a requirement for conformal coatings for printed circuit boards, especially when they have dual cure, UV and moisture, and when the resulting cured films and coatings have low temperature flexibility. The low viscosity is required so that the composition can be coated by dip coating or spray coating.

The compositions of the present invention are useful as conformal coatings for printed circuit boards or printed wire boards, depending on the terminology one desires to use. For the purposes of the present invention these terms are interchangeable. The preferred compositions cure by exposure to a dose of ultraviolet radiation in the amount of as little as 200 millijoules per square centimeter (in air) and still moisture cure in the shadow areas or dark areas, i.e. where the composition is not exposed to the ultraviolet radiation. The compositions are exposed to ultraviolet radiation to cure in air, because they cure so fast under an inert atmosphere, such as nitrogen, that the surface cures before the material below the surface even though it may only be one to three mils in thickness. The fast UV cure under an nitrogen atmosphere might be used in applications where the coatings are very thin, basically a surface cure. The source of the ultraviolet radiation is not critical as long as cure can be obtained. It is preferred to use a broad spectrum wavelength ultraviolet source for radiating the composition to provide cure. Many sources are available commercially.

The following examples are illustrative of the invention which is properly delineated in the claims. In the following examples part or parts represent parts by weight and the viscosity measurements are at 25° C. unless otherwise stated. The compositions in the following examples were cured in an air atmosphere using an LCU (laboratory curing unit) from UVEXS, Inc, Mountain View, Calif., which had a stainless steel belt on which the samples were placed for curing, and which had belt speeds of 3 to 14 feet per minute. This LCU had a medium pressure mercury vapor six inch lamp with a power of 200 watts per inch. The dosage was controlled by the belt speed and the number of passes through the LCU. The dosages were measured by using an International Light Company compact radiometer.

EXAMPLE 1

Compositions were prepared by blending together 37 parts of an acrylamide polydimethylsiloxane (Polymer A) of the average formula

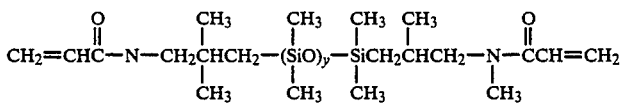

in which y had an average value of about 90, 26.1 parts of a methacrylate polydimethylsiloxane (Polymer B) having the following average formula

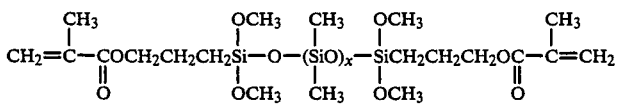

where the polydiorganosiloxane was 20.1 parts wherein x had an average value of 30 and 6 parts wherein x had an average value of 300, 32 parts of isobornyl acrylate, and 0.2 part of tetrabutyl titanate. Several compositions were prepared in which the amount of photoinitiator, 2-hydroxy-2-methylphenylpropanone (PI-1) and 2-methyl-1-[4-(methylthio)phenyl]-2-morpholenopropanone (PI-2), dimethylethanolamine (Amine), and 4-methyl-7-(N,N-diethylamino)-coumarin (PS-1, photosensitizer) were varied and are shown in Table 1. Test coupons of each composition were dip coated and then exposed to ultraviolet radiation to provide a dosage of 1200 mJ/cm$^2$. Coated test coupons were also stored in the dark under atmospheric conditions to observe the moisture curing properties. The results were as described in Table 1. Under surface wrinkling, 4=wrinkles at or less than 5 mils; 6=wrinkles at more than 5 mils; and 10=no wrinkling at 10 mils. Under surface cure, 1=dry or very slightly tacky surface; 2=slightly tacky surface; 3=tacky surface but no smear; 4=slight surface smear; 5=severe surface smear; and 6=oily surface.

TABLE 1

| No. | COMPOSITION PI-1 | PI-2 | AMINE | PS-1 | UV SURFACE WRINKLING | UV SURFACE CURE | ELONGATION % | MODULUS kPa |
|---|---|---|---|---|---|---|---|---|
| 1 | 1.85 | 1.85 | 1.20 | 0.015 | 10 | 3 | 50 | 2765 |
| 2 | 2.50 | 1.85 | 0.75 | 0.015 | 6 | 2 | 52 | 10632 |
| 3 | 2.50 | 1.85 | 1.20 | 0.01 | 4 | 3 | 24 | 5757 |
| 4 | 1.85 | 1.20 | 1.20 | 0.01 | 6 | 1 | 74 | 5116 |
| 5 | 1.85 | 1.85 | 0.30 | 0.015 | 6 | 2 | 65 | 7157 |
| 6 | 1.85 | 1.20 | 0.30 | 0.01 | 10 | 1 | 40 | 7867 |
| 7 | 1.20 | 1.85 | 0.30 | 0.01 | 6 | 3 | 57 | 2248 |
| 8 | 1.85 | 1.20 | 0.75 | 0.015 | 6 | 2 | 52 | 3130 |
| 9 | 1.20 | 1.85 | 0.75 | 0.005 | 10 | 4 | 55 | 4992 |
| 10 | 1.85 | 2.50 | 0.30 | 0.01 | 10 | 2 | 144 | 4585 |
| 11 | 2.50 | 1.85 | 0.75 | 0.005 | 10 | 5 | 69 | 4475 |
| 12 | 1.85 | 1.85 | 0.75 | 0.01 | 6 | 3 | 43 | 2220 |
| 13 | 1.85 | 1.85 | 0.30 | 0.005 | 6 | 4 | 92 | 9735 |
| 14 | 1.85 | 1.85 | 0.75 | 0.01 | 6 | 2 | 52 | 4833 |
| 15 | 1.20 | 1.85 | 1.20 | 0.01 | 10 | 4 | 33 | 2577 |
| 16 | 1.85 | 2.50 | 0.75 | 0.005 | 10 | 1 | 126 | 4654 |
| 17 | 2.50 | 1.2 | 0.75 | 0.01 | 10 | 2 | 111 | 2351 |
| 18 | 1.85 | 2.50 | 1.20 | 0.01 | 10 | 1 | 13 | 2379 |
| 19 | 1.85 | 1.20 | 0.75 | 0.005 | 10 | 2 | 102 | 5357 |
| 20 | 1.20 | 1.20 | 0.75 | 0.01 | 6 | 5 | 102 | 1551 |
| 21 | 1.85 | 1.85 | 1.20 | 0.005 | 10 | 2 | 60 | 1606 |
| 22 | 2.50 | 1.85 | 0.30 | 0.01 | 6 | 2 | 55 | 3171 |
| 23 | 1.20 | 1.85 | 0.75 | 0.015 | 6 | 3 | 74 | 3013 |
| 24 | 2.50 | 2.50 | 0.75 | 0.01 | 10 | 3 | 52 | 6322 |
| 25 | 1.85 | 2.50 | 0.75 | 0.015 | 6 | 4 | 85 | 3647 |
| 26 | 1.20 | 2.50 | 0.75 | 0.01 | 6 | 2 | 72 | 2392 |
| 27 | 1.85 | 1.85 | 0.75 | 0.01 | 6 | 2 | 21 | 4240 |

Compositions 4, 6, 10, 11, 16, 20, and 24 were specifically tested for moisture cure. These were all adequately cured in six days when stored in the dark under atmospheric conditions. All 27 of the above compositions are of this invention. These compositions show various results, however, all were acceptable conformal coating compositions even considering the differences. Many of the compositions which shows wrinkling at five mils thickness are expected to be useful as lower film thicknesses.

EXAMPLE 2

A composition was prepared by mixing 37 parts of Polymer A, 26.1 parts of Polymer B, 32 parts of isobornyl acrylate, 1.8 parts of PI-1, 2.2 parts of PI-2, 0.3 part of Amine, 0.01 part of PS-1, 0.2 part of an adhesion additive which was a blend of 45 weight percent of hexaethoxysilethylene and 55 weight percent of pentaerythritol, and less than 500 ppm of para-methoxyphenol and phenothiazine as stabilizers. The resulting mixture has a viscosity of 0.08 Pa.s and had a shelf life of greater than three months stored in a sealed container in the dark. Test coupons were prepared as described in Example 1 and cured by exposure to UV radiation at a dosage of 1500 mJ/cm$^2$. The coating was about five mils in thickness. The composition cured to an excellent conformal coating without forming a wrinkled surface. It adhered to the coupon surface and when used on a populated board it cured both by the UV exposure and by moisture cure in the dark or shadowed areas.

That which is claimed is:

1. A composition comprising
   (A) at least 20 weight percent based on the total weight of the composition of an acrylamide polydimethylsiloxane having acrylamide end groups bonded to silicon atoms through Si-C bonds and on the average at least 20 to less than 300 dimethylsiloxane units per molecule.
   (B) at least 20 weight percent based on the total weight of the composition of a polydiorganosiloxane having endgroups containing both alkoxy groups and methacrylate groups where there are two alkoxy groups per endgroup bonded to silicon through an Si-O bond and one methacrylate group bonded to silicon through an Si-C bond and having on the average less than 350 diorganosiloxane units per molecule, said diorganosiloxane units being selected from dimethylsiloxane units, diphenylsiloxane units, and methylphenylsiloxane units wherein at least 50 percent of the organic groups of the diorganosiloxane units are methyl,
   (C) at least 20 weight percent based on the total weight of the composition of a reactive diluent selected from the group consisting of isobornyl acrylate, cyclohexyl acrylate, and 2-ethylhexyl acrylate,
   (D) from 0.5 to 10 weight percent based on the total weight of the composition of a photoinitiator combination in which there is at least 0.25 weight percent of based on the total weight of the composition

C$_6$H$_5$—C(O)C(CH$_3$)$_2$—OH and at least 0.25 weight percent of based on the total weight of the composition

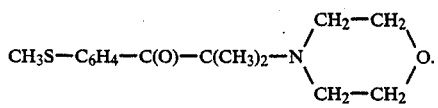

(E) from 0.1 to 2 weight percent based on the total weight of the composition of an amine selected from the group consisting of dimethylethanolamine and diisopropylethylamine, and
   (F) from 0.05 to 1 weight percent based on the total weight of the composition of an organic titanate, where the composition has a viscosity at 25° C. in the range of 0.07 to 0.2 Pa.s.

2. The composition according to claim 1 in which the polydimethylsiloxane of (A) has on the average from 20 to 125 dimethylsiloxane units per molecule, the polydiorganosiloxane of (B) is a polydimethylsiloxane having on the average from 10 to 60 dimethylsiloxane units per molecule, and the reactive diluent of (C) is isobornyl acrylate.

3. The composition according to claim 1 further comprising a photosensitizer.

4. The composition according to claim 1 further comprising an adhesion additive.

5. The composition according to claim 3 in which the photosensitizer is 4-methyl-7-(N,N-diethylamino)-coumarin.

6. The composition according to claim 4 in which the adhesion additive is a mixture of hexamethoxysilethylene and pentaerythritol triacrylate.

7. The composition according to claim 3 in which the photosensitizer is present in an amount of less than 0.5 weight percent based on the total weight of the composition.

8. The composition according to claim 5 in which 4-methyl-7-(N,N-diethylamino)-coumarin is present in an amount of less than 0.5 weight percent based on the total weight of the composition.

9. The composition according to claim 4 in which the adhesion additive is present in an amount of less than one weight percent based on the total weight of the composition.

10. The composition according to claim 6 in which the mixture is present in an amount of less than one weight percent based on the total weight of the composition and the mixture contains from 40 to 60 weight percent based on the weight of the mixture of hexamethoxysilethylene and from 40 to 60 weight percent based on the weight of the mixture of pentaerythritol triacrylate.

11. The composition according to claim 2 in which there are from 70 to 110 dimethylsiloxane units per molecule in (A), there is from 40 to 60 dimethylsiloxane units per molecule in (B), the amount of (A) is from 25 to 40 weight percent based on the weight of the total composition, the amount of (B) is from 20 to 30 weight percent based on the total weight of the composition, and the amount of isobornyl acrylate is from 25 to 45 weight percent based on the total weight of the composition.

12. The composition according to claim 11 in which the polydimethylsiloxane of (A) has the following formula

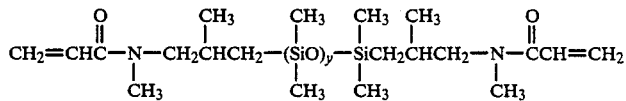

wherein y has a value of from 70 to 110, and the polydiorganosiloxane of (B) has the following formula

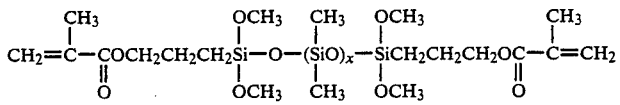

wherein x has a value of from 40 to 60.

13. The composition according to claim 12 further comprising a photosensitizer and an adhesion additive.

14. The composition according to claim 13 in which the photosensitizer is 4-methyl-7-(N,N-diethylamino)-coumarin and the adhesion additive is a mixture of hexamethoxysilethylene and pentaerythritol.

15. The composition according to claim 14 in which 4-methyl-7-(N,N-diethylamino)-coumarin is present in an amount of less than 0.5 weight percent based on the total weight of the composition and the mixture is present in amount of less than one weight percent based on the total weight of the composition and the mixture contains from 40 to 60 weight percent based on the weight of the mixture of the hexamethoxysilethylene and from 40 to 60 weight percent based on the weight of the mixture of the pentaerythritol triacrylate.

16. The composition according to claim 15 further comprising an antioxidant.

* * * * *